United States Patent
Hastings et al.

(10) Patent No.: US 9,819,347 B2
(45) Date of Patent: Nov. 14, 2017

(54) QUANTUM CIRCUIT FOR CHEMISTRY SIMULATION

(71) Applicant: Microsoft Technology Licensing, LLC, Redmond, WA (US)

(72) Inventors: Matthew Hastings, Santa Barbara, CA (US); David Wecker, Redmong, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/118,474

(22) PCT Filed: Feb. 6, 2015

(86) PCT No.: PCT/US2015/014698
§ 371 (c)(1),
(2) Date: Aug. 11, 2016

(87) PCT Pub. No.: WO2015/123083
PCT Pub. Date: Aug. 20, 2015

(65) Prior Publication Data
US 2017/0179960 A1    Jun. 22, 2017

Related U.S. Application Data

(60) Provisional application No. 61/939,195, filed on Feb. 12, 2014.

(51) Int. Cl.
*H03K 19/195*  (2006.01)
*G06N 99/00*   (2010.01)

(52) U.S. Cl.
CPC ......... *H03K 19/195* (2013.01); *G06N 99/002* (2013.01)

(58) Field of Classification Search
CPC .......................... H03K 19/195; G06N 99/002
See application file for complete search history.

(56) References Cited

U.S. PATENT DOCUMENTS

| | | | |
|---|---|---|---|
| 9,514,415 B2* | 12/2016 | Bocharov | G06N 99/002 |
| 2003/0055513 A1* | 3/2003 | Raussendorf | G06N 99/002 700/1 |
| 2005/0015422 A1* | 1/2005 | Kohn | G06N 99/002 708/446 |
| 2006/0123363 A1 | 6/2006 | Williams et al. | |
| 2006/0224547 A1 | 10/2006 | Ulyanov et al. | |

(Continued)

OTHER PUBLICATIONS

Banerjee et al., "An Algorithm for Minimization of Quantum Cost," *Appl. Math. Inf. Sci.*, 6:157-165 (Jan. 1, 2012).

(Continued)

*Primary Examiner* — Jason M Crawford
(74) *Attorney, Agent, or Firm* — Klarquist Sparkman, LLP

(57) ABSTRACT

Quantum circuits for chemistry simulation are based on second quantization Hamiltonian coefficients for one-body and two-body interactions. Jordan-Wigner series that conserve parity can be defined so that selected CNOT gates are removed from the associated circuits. Basis change gates such as Hadamard or Y-gates can be coupled to some or all qubits of a quantum circuit or cancelled in view of corresponding gates in adjacent circuits. In some examples, CNOT gates can be moved to different circuit locations.

20 Claims, 15 Drawing Sheets

(56) References Cited

U.S. PATENT DOCUMENTS

| | | | |
|---|---|---|---|
| 2011/0049475 A1 | 3/2011 | Hollenberg et al. | |
| 2012/0159272 A1* | 6/2012 | Pesetski .................. | B82Y 10/00 714/724 |
| 2014/0025926 A1* | 1/2014 | Yao ......................... | B82Y 10/00 712/32 |

OTHER PUBLICATIONS

International Preliminary Report on Patentability from International Application No. PCT/US2015/014698, dated Jun. 1, 2016, 12 pages.
International Search Report and Written Opinion from International Application No. PCT/US2015/014698, dated Sep. 3, 2015, 14 pages.
Jones et al., "Faster quantum chemistry simulation on fault-tolerant quantum computers," New Journal of Physics, 14:1-35 (Nov. 27, 2012).
Meyer, "Sophisticated Quantum Search without Entanglement," *Physical Review Letters*, 85:1-8 (Aug. 28, 2000).
Rahman et al., "Two-Qubit Quantum Gates to Reduce the Quantum Cost of Reversible Circuit," 41st IEEE International Symposium on Multiple-Valued Logic, 7 pages (May 23, 2011).
Szyprowski et al., "Reducing Quantum Cost in Reversible Toffoli Circuits," Proceedings of Reed-Muller Workshop, 10 pages (May 25, 2011).
Wecker et al., "Can quantum chemistry be performed on a small quantum computer?" available at: http://arxiv.org/pdf/1312.1695v2.pdf, 15 pages (Jan. 6, 2014).
Written Opinion of the International Preliminary Examining Authority from International Application No. PCT/US2015/014698, dated Feb. 17, 2016, 8 pages.

* cited by examiner

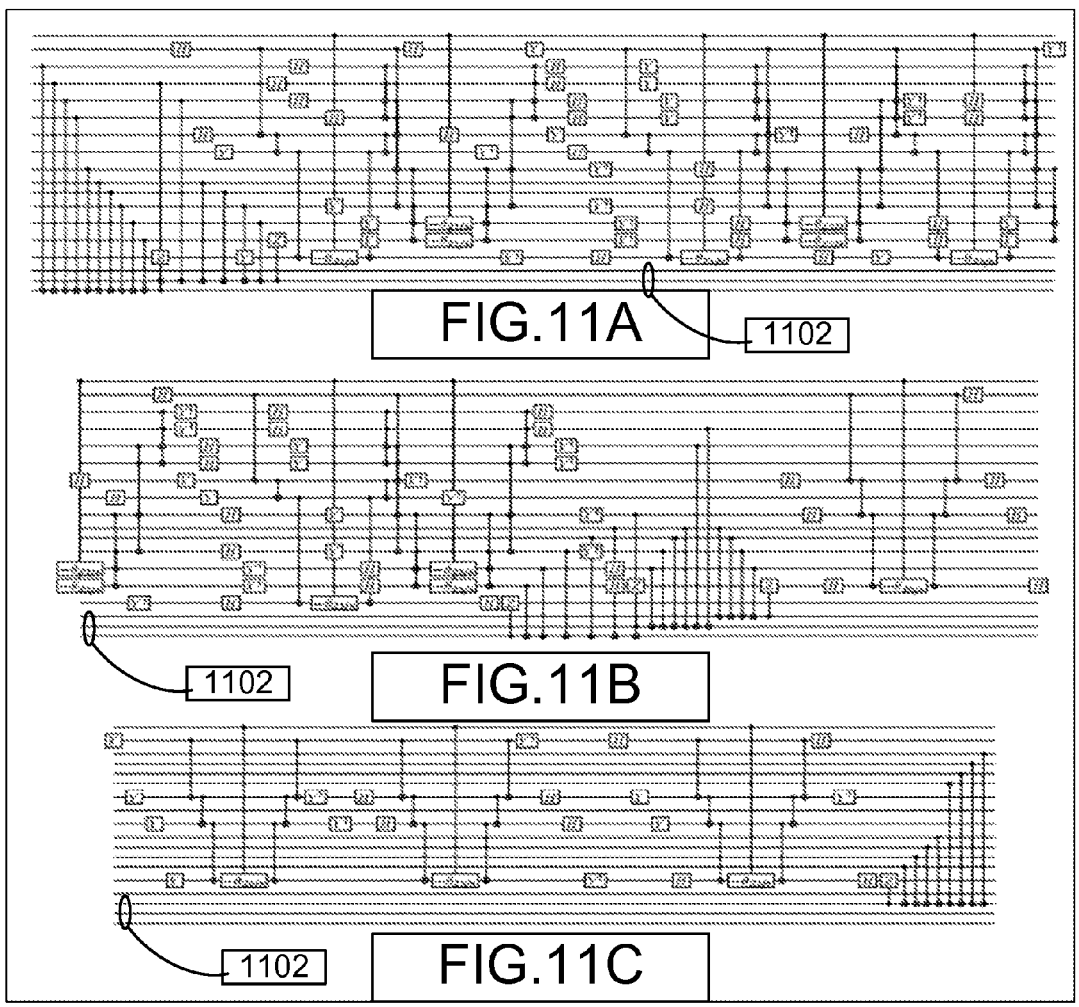

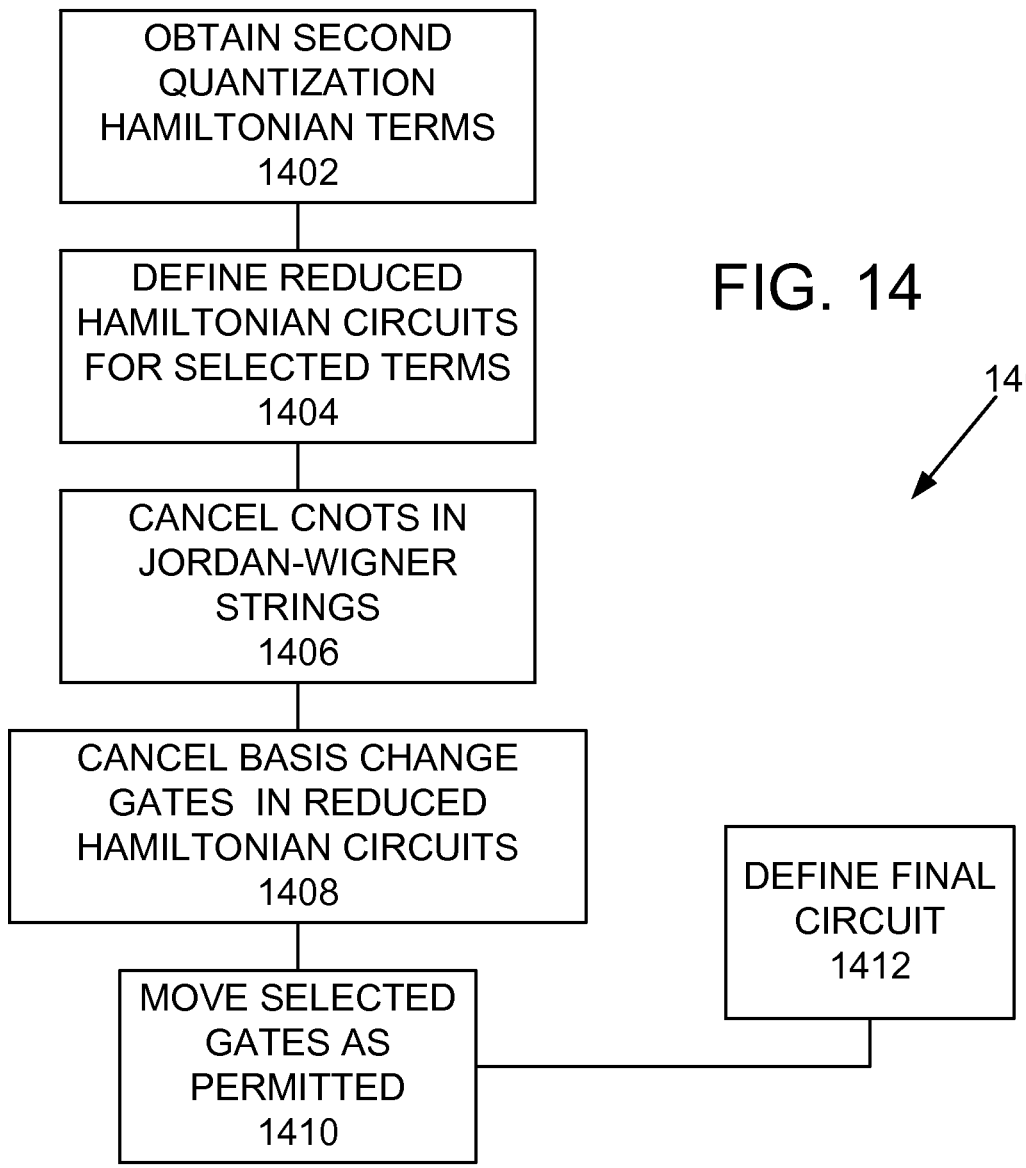

ions in a second quantized Hamiltonian using reduced Jordan-Wigner series.

QUANTUM CIRCUIT FOR CHEMISTRY SIMULATION

CROSS REFERENCE TO RELATED APPLICATIONS

This is the U.S. National Stage of International Application No. PCT/US2015/014698, filed Feb. 6, 2015, which was published in English under PCT Article 21(2), which in turn claims the benefit of U.S. Provisional Application No. 61/939,195, filed Feb. 12, 2014. The provisional application is incorporated herein in its entirety.

FIELD

The disclosure pertains to quantum computational systems for evaluation of chemical systems.

BACKGROUND

One application of quantum computing is in the computation of molecular properties that are defined by quantum mechanics. Such quantum computations would have a variety of applications such as in pharmaceutical research and development, biochemistry, and materials science. Conventional computing approaches are suitable for only the simplest quantum chemical computations due to the significant computational resources required. Typical many-body systems of interest generally cannot be evaluated. Quantum chemical computational techniques can require significantly fewer computational resources, and permit computation of the properties of many-body systems.

Current approaches to quantum chemical computations exhibit significant limitations. A standard circuit model uses one and two body Hamiltonian terms. This circuit changes basis and then entangles all of the required qubits, rotates the result, unentangles the qubits, and finally changes back to the original basis. While this conventional approach can produce useful results, very large numbers of gate operations are required, and improved approaches are needed.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Quantum circuits for chemistry simulation include at least one reduced Jordan-Wigner circuit coupled to a plurality of qubits and include a plurality of CNOT gates corresponding to respective spin orbitals. One or more CNOT gates associated with a full Jordan-Wigner series is omitted or, alternatively, is included in a reduced Hamiltonian circuit coupled to qubits that are associated with the spin orbitals. The reduced Hamiltonian circuit can be based on one body or two body Hamiltonian coefficients associated with a material of interest. In some examples, the circuit includes a plurality of reduced Hamiltonian circuits situated in series and having different basis change gates. In other examples, the circuit includes an output side reduced Jordan-Wigner string corresponding to the input side reduced Jordan-Wigner string, wherein the output side reduced Jordan-Wigner string is situated after the plurality of reduced Hamiltonian circuits. In some examples, the reduced Hamiltonian circuits include Hadamard gates and Y-gates as basis change gates. In other examples, the CNOT gates are coupled to an ancillary or entanglement qubit.

In some examples, methods of defining a quantum circuit associated with at least a selected one-body or two-body Hamiltonian coefficient associated with second quantization comprise defining a reduced Jordan-Wigner string associated with spin orbitals coupled by a Hamiltonian coefficient. A reduced Hamiltonian circuit is defined based on the Hamiltonian coefficient, and the reduced Jordan Wigner string is coupled to the reduced Hamiltonian circuit on an input side. In some examples, CNOT gates of the reduced Jordan Wigner circuit are coupled to an entanglement qubit.

The foregoing and other features, and advantages of the disclosed technology will become more apparent from the following detailed description, which proceeds with reference to the accompanying figures.

BRIEF DESCRIPTION OF THE DRAWINGS

FIGS. 11A-11C illustrate a circuit using ancillary qubits.

FIG. 14 is a block diagram of a computer-implemented quantum circuit design method.

DETAILED DESCRIPTION

Figure 1A:
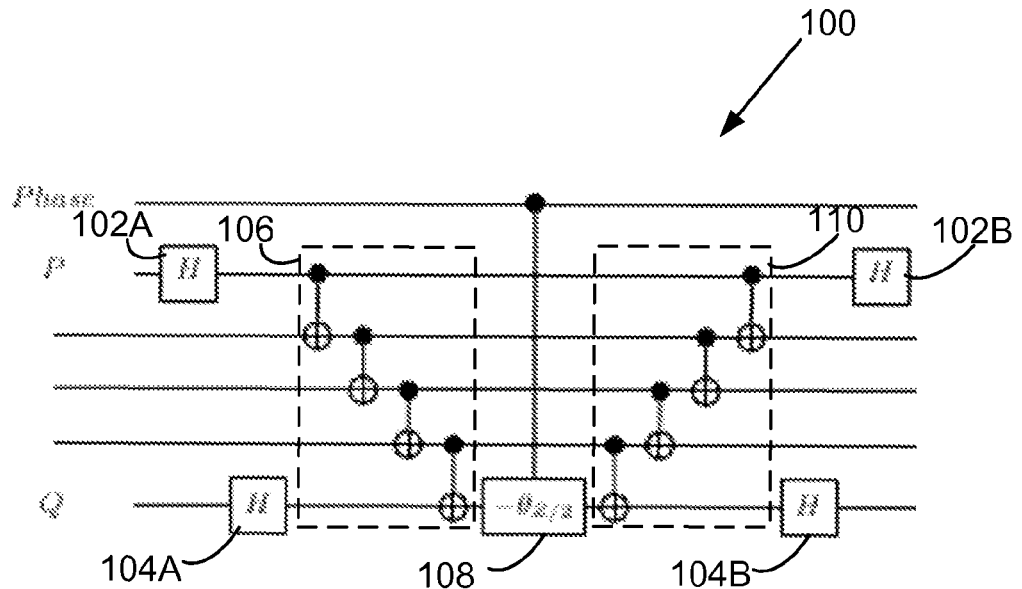
FIGS. 1A-1B are schematic diagrams of conventional quantum computing circuits for performing chemical calculations based on one-body terms in a second quantized Hamiltonian.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best," "minimum," or the like. It will be appreciated that such descriptions are intended to indicate that a selection among many used functional alternatives can be made, and such selections need not be better, smaller, or otherwise preferable to other selections. The term "sequence" is used to describe a series of operations that are executed in series as well as to describe series of quantum circuits or gates that are coupled in series.

Quantum computational methods and apparatus are described herein with respect to quantum gates that are used to implement quantum computations. The quantum gates are representations of physical operations that are to be applied to one or more qubits that can be constructed using various physical systems. In one example, qubit operations (i.e., gates) are applied to qubits defined by states of polarization of optical radiations. Quantum circuits can be defined by a plurality of quantum gates, arranged in a particular order.

For convenience, quantum circuits as described be situated sequentially, first, last, prior to, before, or other terms defining a circuit order from an input to an output.

In the disclosed examples, quantum circuits and methods are disclosed that permit reduction in the complexity of entanglement from O(N) to O(1) within a circuit that defines operations corresponding to a multi-body Hamiltonian. In some example, Hadamard gates are used, wherein the Hadamard gate H is defined as:

$$H = \frac{1}{\sqrt{2}}\begin{pmatrix} 1 & 1 \\ 1 & -1 \end{pmatrix}.$$

A Pauli Y-gate is defined as:

$$Y = \begin{pmatrix} 0 & -i \\ i & 0 \end{pmatrix}.$$

Quantum simulation of molecules can be based on a decomposition of a molecular time evolution operator $\hat{U}$. For small, simple molecules that exhibit substantial symmetries such as the hydrogen molecule, a molecular Hamiltonian can be implemented exactly using relatively small numbers of quantum gates. For more complex molecules, such simple decompositions may be difficult or impossible. Nevertheless, for many chemical systems, suitable exact or approximate decompositions are available.

In a typical method, the molecular chemical Hamiltonian is expressed in second quantized form, and the Jordan-Wigner transformation is used to express terms of the Hamiltonian in a spin ½ representation. A unitary propagator is decomposed into a product of time-evolution operators for non-commuting terms of the molecular Hamiltonian based on a Trotter-Suzuki expansion in which terms associated with non-commutation are neglected. Quantum circuits are defined so as to correspond to each of the time-evolution operators. Using second quantization and Jordan-Wigner transformation, a Hamiltonian is generated that can be represented as qubit operations. Thus, a quantum circuit can implement a quantum algorithm for simulating a time-evolution operator obtained from a molecular Hamiltonian. In the following, such quantum circuits and quantum computational methods are described in more detail.

In a basis having N spin orbitals, a Hamiltonian H associated with one and two body interactions of electrons can be represented as:

$$H = \sum_{pq} t_{pq} c_p^\dagger c_q + \frac{1}{2} \sum_{pqrs} V_{pqrs} c_p^\dagger c_q^\dagger c_r c_s.$$

The terms in such a representation can be obtained using classical computing methods.

In many systems of interest, the terms with the largest magnitude are $H_{pp}$ terms. The $H_{pqqp}$ terms are typically next in magnitude, followed by the $H_{pq}$ terms, the $H_{pqqr}$ terms, and finally the $H_{pqrs}$ terms, but other orderings by magnitude are possible. The $H_{pqqr}$ and the $H_{pq}$ terms are generally related as follows after a basis transformation of the single particle states to find a Hartree-Fock ground state:

$$t_{pq} + \sum_r V_{prrq} n_r = 0,$$

wherein $n_r=0,1$ is the occupation number in a Hartree-Fock state.

As noted above, quantum chemistry computations can be conveniently expressed in a so-called second quantization form, wherein a Hamiltonian operator H is expressed as:

$$H = \sum_m h_{pq} p^\dagger q + \sum_m h_{pqrs} p^\dagger q^\dagger rs \qquad (1)$$

wherein p, q, r, and s represent spin orbital locations, with each molecular orbital occupied by either a spin-up or spin-down particle, or both or neither. The $h_{pq}$ and $h_{pqrs}$ values are the amplitudes associated with such particles and the terms with a dagger (†) correspond to particle creation and terms without a dagger refer to particle annihilation. The $h_{pq}$ and $h_{pqrs}$ values can be obtained exactly or estimated. For example using a Hartree-Fock procedure, $$h_{pq} = \int d\vec{x} \chi_p^*(\vec{x})\left(-\frac{1}{2}\nabla^2 - \sum \frac{Z_\alpha}{r_{\alpha x}}\right)\chi_q(\vec{x}), \text{ and}$$

$$h_{pqrs} = \int d\vec{x}_1 d\vec{x}_2 \frac{\chi_p^*(\vec{x}_1)\chi_q^*(\vec{x}_2)\chi_r(\vec{x}_2)\chi_s(\vec{x}_1)}{r_{12}},$$

wherein the integrals are performed over volume coordinates associated with x, $\chi_p(x)$ denotes a single particle basis, $r_{\alpha x}$ and $r_{12}$ are distances between the $\alpha^{th}$ nucleus and the electron and the distance between electrons 1 and 2, respectively.

The second-quantized Hamiltonian can be mapped to qubits. The logical states of each qubit can be associated with occupancy of a single-electron spin-orbital, wherein 0 denotes occupied, and 1 denotes unoccupied. A system with N single-electron spin-orbitals can be represented with N qubits. Systems with any numbers of electrons up to N can be represented using N qubits. In other representations, larger numbers of qubits can be used.

The Jordan Wigner transformation can be used to transform creation and annihilation operators so as to be represented using Pauli spin matrices. The time-evolution operator may not be readily representable as a sequence gates, but a Hamiltonian expressed as a sum of one and two-electron terms whose time-evolution operators can each be implemented using a sequence of gates. The unitary time evolution operator can be approximated using Trotter-Suzuki relations based on time-evolution of non-commuting operators. For a Hamiltonian $$H = \sum_{i=1}^{N} \hat{h}_i,$$

a Trotter-Suzuki decomposition can be expressed as:

$$U(t) = e^{iHt} = (e^{i\hat{h}_1 t} e^{i\hat{h}_2 t} \cdots e^{i\hat{h}_N t})$$

Errors associated with non-commutative operators can be reduced using a Trotter-Suzuki expansion. For example, a time evolution operator for a system associated with non-commutating operators A and B can be expressed as:

$$e^{A+B} = (e^{A/n} e^{B/n})^n,$$

which is exact for n→∞. In typical quantum computing approaches, each term in a product of exponentials of operators is associated with a corresponding quantum circuit.

Cancellation of Jordan-Wigner Strings

Each Trotter-Suzuki step typically comprises a step implementing a unitary transformation $\exp(iA\delta_t)$ controlled by an additional ancilla qubit that is used to perform phase estimation, wherein A is a term in the series expansion of H shown above, and $\delta_t$ is an angle which depends upon the Trotter-Suzuki step. A second quantized basis can be used, with one qubit per spin orbital. For an $H_{pq}$ term with p<q, the associated controlled unitary transformation is $\exp(i(X_p X_q +$ $Y_p Y_q)(Z_{p+1} Z_{p+2} \ldots Z_{q-1})\theta$ wherein a product of $Z_{p+1} Z_{p+2} \ldots Z_{q-1}$ implements a Jordan-Wigner string and $\theta$ depends upon a coefficient $t_{pq}$, and on $\delta_t$. For $H_{pqrs}$, p<q<r<s there are several possible controlled unitary transformations, of the form $\exp(i(X_p X_q X_r X_s)(Z_{p+1} Z_{p+2} \ldots Z_{q-1})(Z_{p+1} Z_{p+2} \ldots Z_{s-1})\theta)$ with Jordan-Wigner strings from p+1 to q-1 and from r+1 to s-1. For each p,q,r,s, it may be necessary to implement several of these terms, with $X_p X_q X_r X_s$ replaced by other Pauli operators and combinations thereof, such as $X_p X_q Y_r Y_s$, etc. . . . , having an even number of Xs and an even number of Ys. These different choices are referred to X, Y basis choices.

For convenient illustration, qubits are labeled and arranged in a sequential order, typically from p to q, but other orderings are possible. In the examples described herein, each spin orbital is associated with a single qubit, but additional qubits can be used.

As used herein, a reduced Jordan-Wigner (or entanglement) sequence applied to p,q,r,s qubits corresponding to spin-orbitals p,q,r,s wherein p,q,r,s are integers such that p<q<r<s, includes CNOT gates coupled to qubits p, . . . s, except for qubits p,q,r,s. Such a sequence is typically used in processing in association with two body ($H_{pqrs}$) terms in a second quantization representation of a Hamiltonian. A reduced Jordan-Wigner (or entanglement) sequence applied to p,q qubits corresponding to spin-orbitals p,q wherein p,q are integers such that p<q, includes CNOT gates coupled to qubits p, . . . q, except for qubits p,q. Such a sequence is typically used in processing in association with one body $H_{pq}$ terms in a second quantization representation of a Hamiltonian. In either case, the Jordan-Wigner string is associated with computing the parity of a given set of qubits.

A reduced (two body) Hamiltonian circuit includes one or more input/output basis change gates (for example, Hadamard gates or Y gates) coupled to p,q,r,s qubits and one or more input/output CNOT gates coupling p,q,r,s qubits. Such input or output CNOT gates can be referred to as interior Jordan-Wigner sequences as they can be provided within the reduced circuit. In some cases, both input side and output side basis change gates are included, or only input or output side basis change gates, or only selected ones of input or output side basis change gates. Such a circuit also includes a controlled rotation gate (a cntol-Z gae) defined by a value of a two body Hamiltonian coefficient of the form $H_{pqrs}$ and applied to a qubit associated with an s-spin orbital. A reduced (one body) Hamiltonian circuit includes one or more input/output basis change gates (for example, Hadamard gates or Y gates) coupled to p,q qubits and one or more input/output CNOT gates coupling p,q qubits. Such input or output CNOT gates can be referred to as interior Jordan-Wigner sequences as they can be provided within the reduced circuit. In some cases, both input side and output side basis change gates are included, or only input or output side basis change gates, or only selected ones of input or output side basis change gates. Such a circuit also includes a control rotation gate defined by a value of a one body Hamiltonian coefficient of the form $H_{pq}$ and applied to a qubit associated with an q-spin orbital.

Figure 1B:
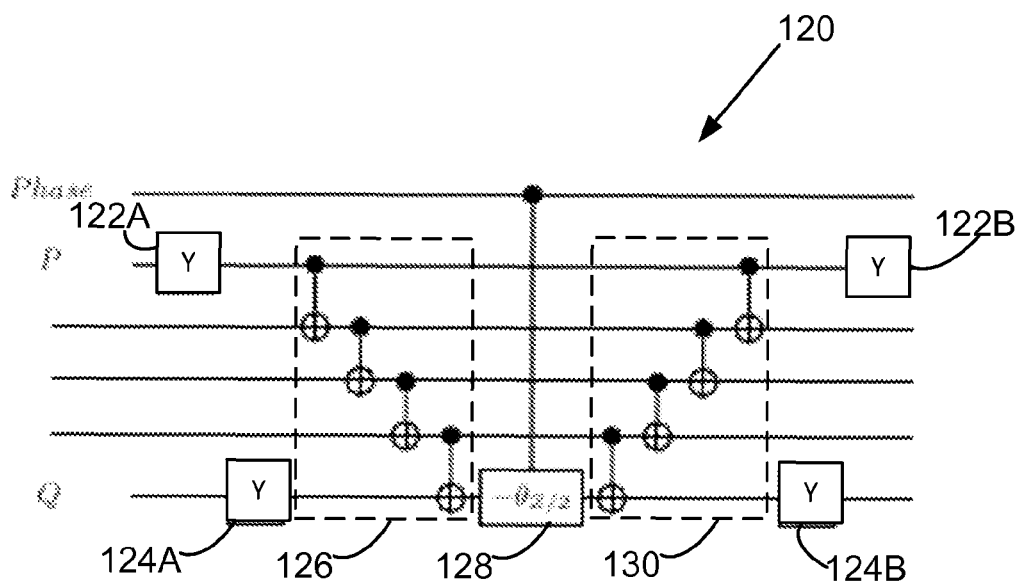

A conventional circuit for implementation of $H_{pq}$ terms is shown in FIGS. 1A-1B. In the example of FIGS. 1A-1B and other examples, only selected qubits are shown for convenient illustration. Referring to FIG. 1A, Hadamard gates 102A, 104A implement a change in basis from state |0> to state (|0>−|1>)/√2 for qubits P and Q. A first sequence of CNOT gates 106 (an entanglement sequence or Jordan-Wigner string) performs Jordan-Wigner entanglement operations coupling qubits P, P+1, . . . , Q, and a controlled rotation circuit 108 applies a rotation/phase change associated with a quantum computation under consideration to the Q qubit. The circuit 108 is generally defined based on a Hamiltonian or phase matrix associated with a chemical system of interest, in this case, based on a value of $H_{pq}$. A second sequence 110 of CNOT gates (a Jordan-Wigner string) is applied coupling qubits P, P+1, ... Q, followed by Hadamard circuits 102B, 104B that that perform an additional change of basis, returning to an input basis as $H^2 = YY^\dagger = I$, wherein I is the identity matrix.

Similar processing is also required in a Y-basis. Referring to FIG. 1B, Pauli Y-gates (hereinafter simply Y-gates) 122A, 122B and 124A, 124B are situated to implement a change in basis from state |0⟩ to state i|1⟩ for qubits P and Q, respectively. Entanglement sequences (Jordan-Wigner sequences) 126, 130 of CNOT gates couple qubits P, P+1, ..., Q and are situated before and after and a rotation/phase gate 128 that is based on a Hamiltonian or phase operator of a quantum system of interest, in this case, based on $H_{pg}$.

For computations based on $H_{pq}$, the circuits of FIGS. 1A-1B are repeated in series for each Trotter-Suzuki step. Typically circuits are provide for all combination of p, q, so that if N spin orbitals are used, $N^2$ circuits are needed for each Trotter-Suzuki step.

Figure 1C:
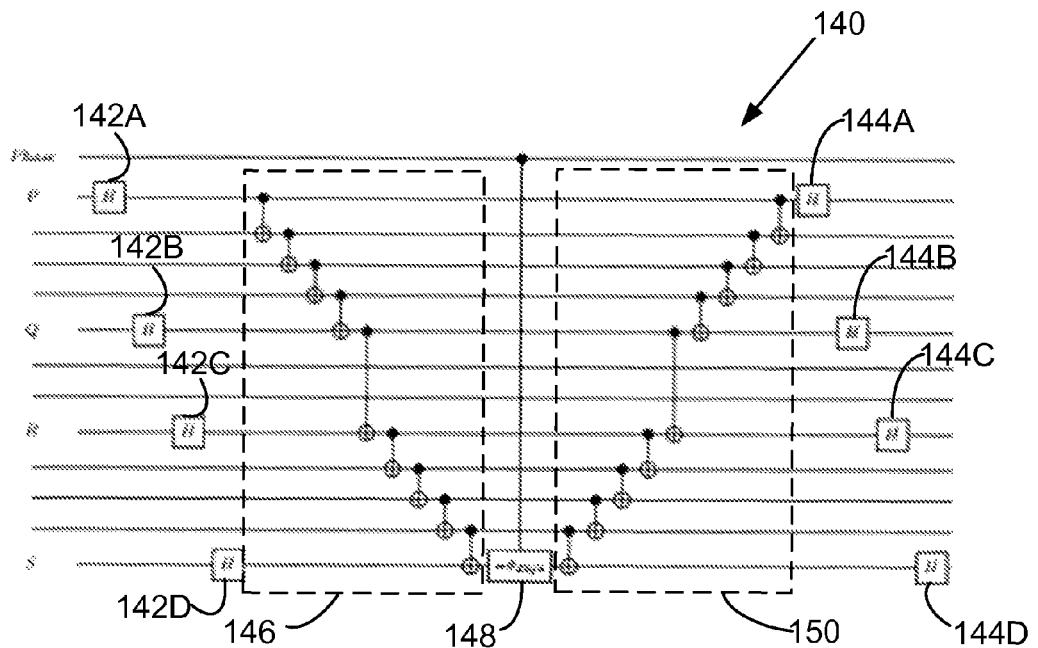
FIGS. 1C-1D are schematic diagrams of conventional quantum computing circuits for performing chemical calculations based on two-body terms in a second quantized Hamiltonian.
Figure 1D:
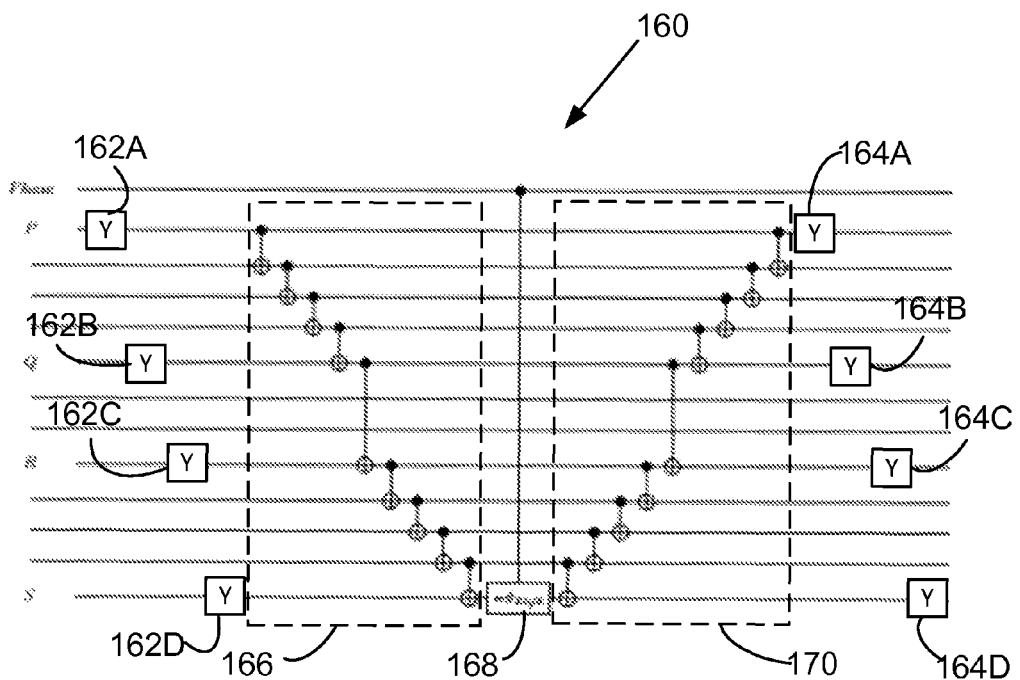

FIGS. 1C-1D illustrate portions of a quantum circuits 140, 160 that are defined based on two body interactions and implement operations associated with $H_{pqrs}$ terms. The circuit 140 of FIG. 1C includes input side Hadamard gates 142A-142D coupled to qubits P, Q, R, S, respectively, and a first CNOT entanglement (Jordan-Wigner) sequence 146 is then applied. The sequence 146 includes CNOT gates that couple qubits P, P+1, ..., S but qubits R, Q are directly coupled, and CNOT gates are not included to couple Q and Q+1, Q+1 and Q+2, ..., R-1, R. A controlled rotation circuit 148 associated with a Hamiltonian term of interest (i.e., $H_{pqrs}$) receives the entangled qubits, and an output side CNOT entanglement sequence 150 similar to the sequence 146 is then applied. Output side Hadamard gates 144A-144D then implement basis changes to the input bases for qubits P, Q, R, S. The circuit 160 of FIG. 1D includes input side Y gates 162A-162D that implement change of bases for qubits P, Q, R, S, respectively, and a first CNOT entanglement sequence 166 that situated to be applied after the basis changes and the Jordan Wigner sequence 146. A controlled rotation circuit 168 associated with a Hamiltonian coefficient of interest ($H_{pqrs}$) is then coupled to the S qubit. An output side CNOT entanglement sequence 160 is configured as shown (and similar to the entanglement sequences of FIG. 1C) and output side Y gates 164A-164D are coupled to qubits P, Q, R, S, respectively, to return to the original basis prior to the input side Y gates 162A-162D.

The two body circuits of FIGS. 1C-1D are similar to the one body circuits of FIGS. 1A-1B except that four spin-orbitals (p, q, r, s) are included, and there will be 2, 4, 6 or 8 copies of the circuit. As shown in FIGS. 1C-1D, the number of entanglement gates (CNOTs) used grows larger with each successive term. As the number of spin-orbitals grows (N), the number of CNOTs grows with the same order (O(N)). The number of CNOT gates required can be significantly reduced in the disclosed circuits and methods as discussed below. Note also that FIGS. 1A-1D show gate sequences for a single Trotterization step, and for many such steps, application of large numbers of CNOT gates in entanglement sequences can make implementation difficult.

Figure 2:
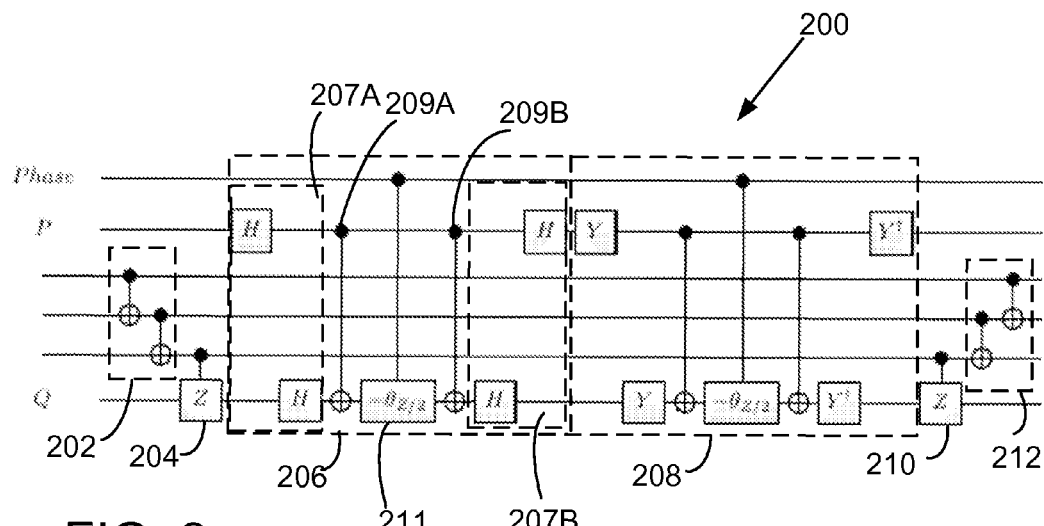
FIGS. 2-3 illustrate quantum circuits for performing chemical calculations based on one-body terms in a second quantized Hamiltonian using reduced Jordan-Wigner series.

With reference to FIG. 2, an alternative circuit 200 for computation based on one-body terms $H_{pq}$ includes an initial entanglement sequence 202 of CNOT gates that couple qubits P+1, P+2, ..., Q-1. An initial control-Z gate 204 couples a phase qubit and a Q qubit. An H-basis circuit 206 includes a set 207A of Hadamard basis change gates that are coupled to P and Q qubits followed by a CNOT gate 209A coupling the P and Q qubits. A control-Z gate 211 is coupled to the phase qubit and the Q qubit and applies a phase based on the value of $H_{pqrs}$. Subsequent to the control-Z gate 211, a CNOT gate 209B is applied followed by a set 207B of Hadamard gates that perform a basis change back to the original basis. A circuit 208 then follows that includes Y-gates for a basis change along with CNOT gates and a control-Z gate that area similarly situated as the Hadamard gates and CNOT gates 209A, 209B of circuit 206. A control-Z gate 210 and a final entanglement sequence 212 are then coupled at the output of the circuit 208. The initial entanglement sequence 202 includes fewer CNOT gates than the conventional circuit of FIG. 1A, and the entanglement sequences within the circuits 206, 208 couple only the P and Q qubits.

Additional circuits such as circuits 206, 208 can be used for additional Trotter-Suzuki steps. For convenience, circuits such as the circuits 206, 208 are referred to as H-basis circuits and Y-basis circuits, respectively. Although an H-basis circuit precedes a Y-basis circuit in FIG. 2, other orders can be used, for example, Y-basis circuits prior to H-basis circuits. In a series implementing additional Trotter-Suzuki steps, an initial entanglement sequence and an initial control-Z gate are provided, followed by alternating H-basis and Y-basis circuits. A final control-Z gate and a final entanglement sequence follow the alternating H-basis and Y-basis circuits.

Figure 3:
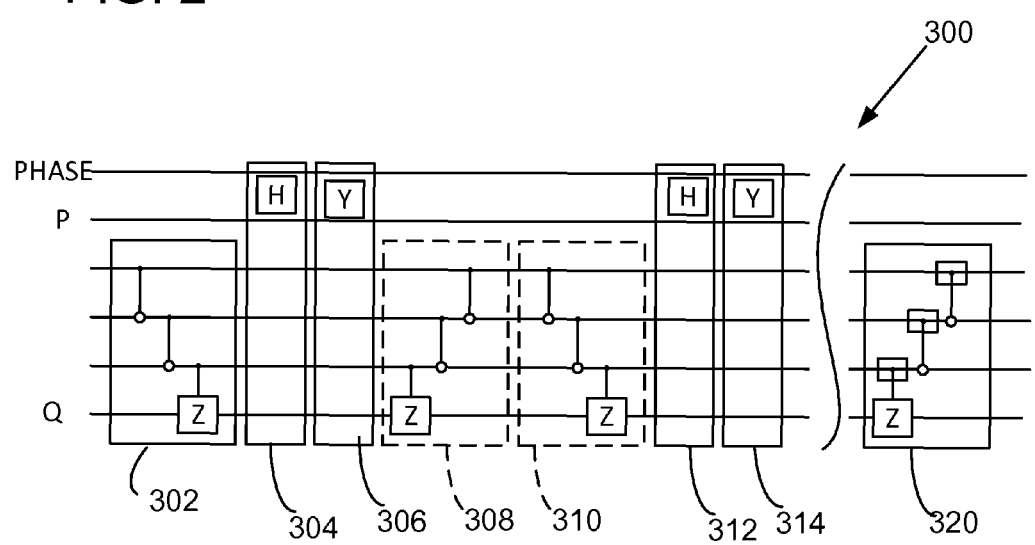

Referring to FIG. 3, a circuit 300 includes an initial Jordan-Wigner sequence 302 that includes CNOT gates coupling qubits P+1, P+2, ..., Q-1 followed by a control-Z gate. An H-basis circuit 304 and a Y-basis circuit (similar to the circuits 206, 208 of FIG. 2) apply phase/rotation changes based on a value of $H_{pq}$. While a final gate sequence 308 associated with the circuits 304, 306 could be included, along with an initial gate sequence 310 for the next H-basis, Y-basis sequence, this is unnecessary. The product $CNOT^2 = Z^2 = I$, wherein I is the identity matrix, so that the combination of the sequences 308, 310 is the identity operator, and thus these sequences can be eliminated. Additional Trotter-Suzuki steps are applied by an H-circuit 312 and a Y-circuit 314 and additional circuits not shown. A final Y-circuit is followed by a final control-Z/CNOT gate sequence 320.

Figure 4:
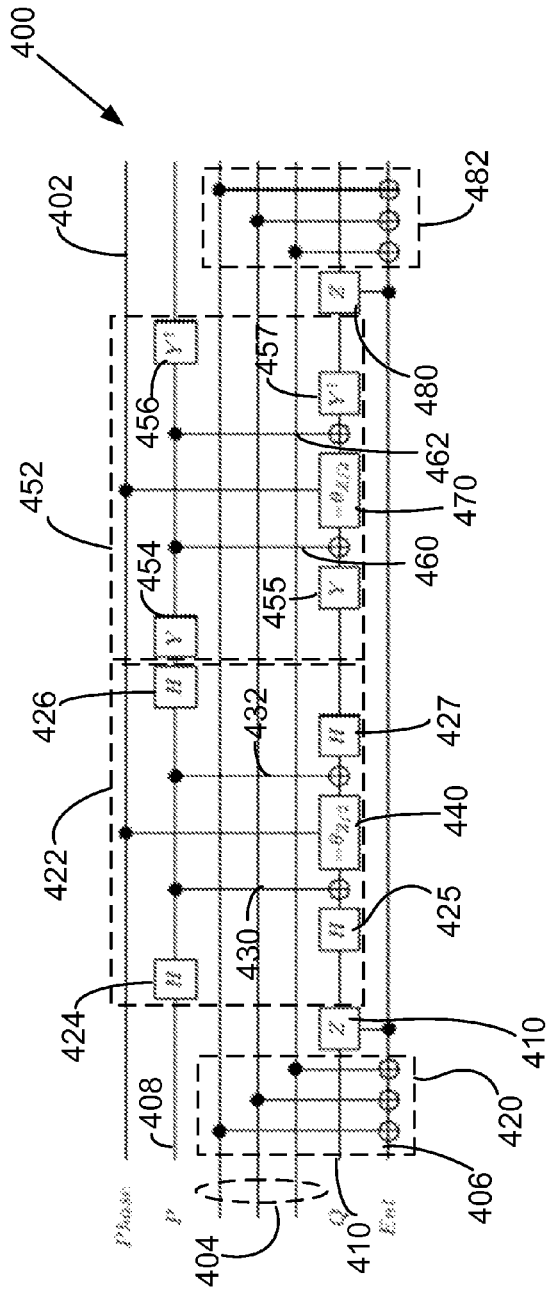
FIG. 4 illustrates a quantum circuit for performing chemical calculations based on one-body terms in a second quantized Hamiltonian that includes an entanglement qubit and using both Hadamard gates and Y-gates as basis change gates.

Circuits for processing based on $H_{pq}$ values can be further simplified with addition of an auxiliary qubit referred to for convenience as an "entanglement" qubit. A quantum circuit for computation based on N spin orbitals can then include a phase qubit, computation qubits I, ..., N, and an entanglement qubit. Portions of an example circuit 400 are shown in FIG. 4, in which only qubits P, P+1, ..., Q 404 are shown along with a phase qubit 402 and an entanglement qubit 406. Qubits 408, 410 are associated with orbitals P and Q, respectively. A set 420 of CNOT gates couples each of the qubits P+1, ..., Q-1 to the entanglement qubit 406, and a control-Z gate 410 couples the entanglement qubit 406 to the Q qubit. An H-circuit 422 includes Hadamard gates 424, 425, 426, 427 coupled to the P and Q qubits for a basis transformations, and CNOT gates 430, 432 that couple the P qubit to the Q qubit. A control-Z gate 440 is situated between the CNOT gates 430, 432 and applies a phase change/rotation based on the value of $H_{pq}$. A Y-circuit 452 includes Y-gates 454, 455, 456, 457 coupled to the P and Q qubits for a basis transformations, and CNOT gates 460, 462 that couple the P qubit to the Q qubit. A control-Z gate 470 is situated between the CNOT gates 460, 462 and applies a phase change/rotation based on the value of $H_{pq}$. The circuit 400 can be used for a plurality of Trotter-Suzuki iterations with additional copies of circuits such as circuits 422, 452. A final control-Z gate 480 and a set 482 of CNOT gates follow a final Y-circuit.

Figure 5A:
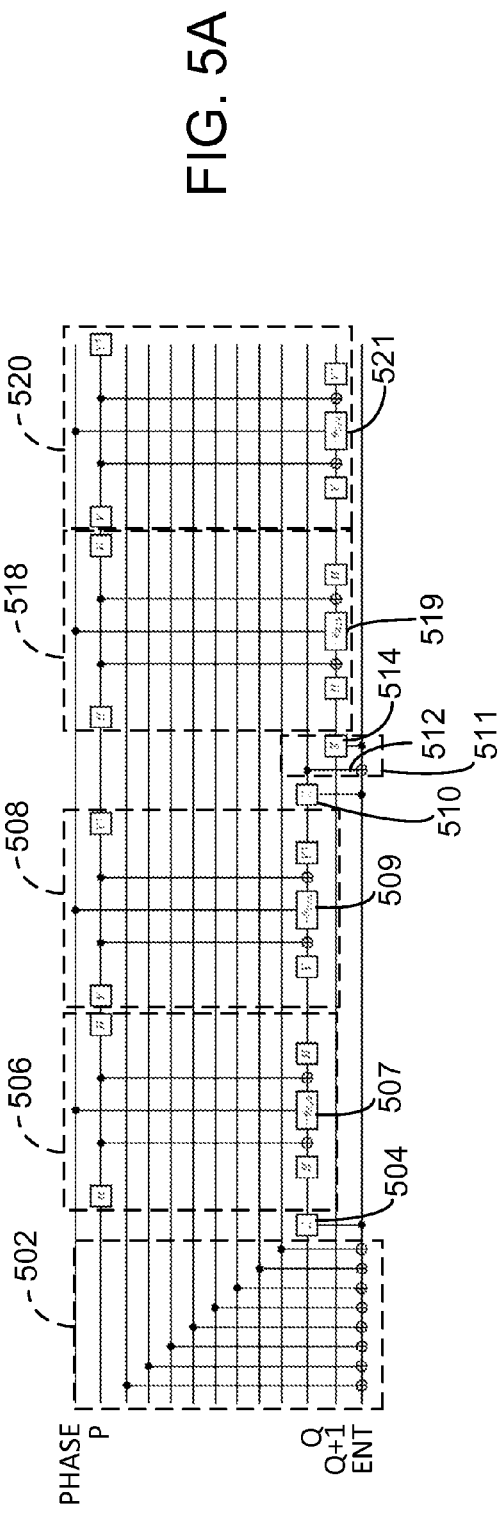
FIG. 5A illustrates an alternative quantum circuit that includes an entanglement qubit for performing chemical calculations based on one-body terms in a second quantized Hamiltonian for spin orbital pairs P, Q and P, Q+1.
Figure 5B:
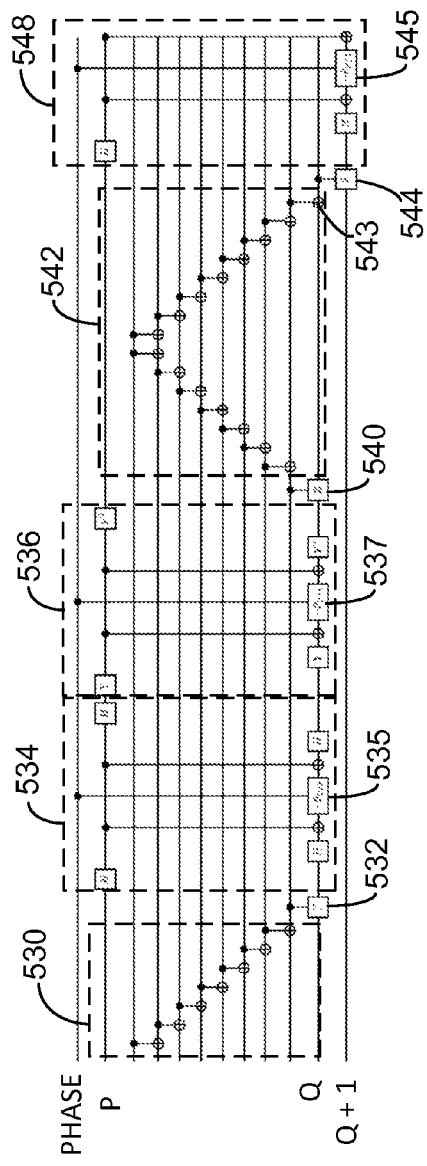
FIGS. 5B-5C illustrate alternative quantum circuits for performing chemical calculations based on one-body terms in a second quantized Hamiltonian for spin orbital pairs P, Q and P, Q+1.
Figure 5C:
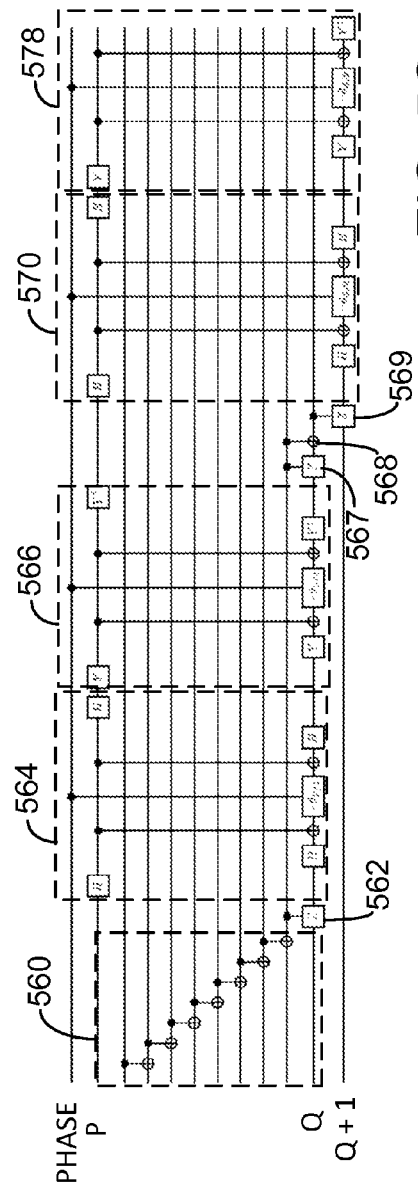

Additional one-body circuits are shown in FIGS. 5A-5C. Referring to FIG. 5A, a circuit includes a set 502 of CNOT gates coupling qubits P+1, P+2, . . . , Q−1 to an entanglement qubit. A control-Z gate 504 is followed by an H-basis circuit 506 and a Y-basis circuit 508 that include CNOT gates coupling the P, Q qubits, basis change gates (H or Y, respectively), and control rotation gates 507, 509 based on an $H_{pq}$ value. A control-Z gate 510 coupling the Q and Entanglement qubits follows the Y-basis circuit 508, and corresponds to the control Z gate 504. Circuit 511 includes a CNOT gate 512 coupling the Q qubit to the Entanglement qubit and a control-Z gate coupling the Q+1 qubit and the Entanglement qubit. The CNOT gate 512 be viewed as an additional gate that is required in the set 502 for processing based on spin orbitals P, Q+1, i.e. $H_{p(q+1)}$. While conventionally a mirror image set of CNOT gates corresponding to the set 502 is provided, this mirror image set combined with a preparatory set for the $H_{p(q+1)}$ leaves only the CNOT gate 512. An H-basis circuit 518 and Y-basis circuit 520 for the P, Q+1 include control rotation gates 519, 521 based on a value of $H_{p(q+1)}$. Circuits for additional Trotter-Suzuki steps, or for other spin orbitals can be included as well. In any case, serially processing qubits P, Q and P, Q+1 requires only single additional CNOT coupling the Q and Entanglement qubits at the transition between P, Q and P, Q+1.

Referring to FIG. 5B, a circuit includes a set 530 of CNOT gates coupling qubits (P+1, P+2), . . . , (Q−2,Q−1). A control-Z gate 532 is followed by an H-basis circuit 534 and a Y-basis circuit 536 that include CNOT gates coupling the P, Q qubits, basis change gates (H or Y, respectively), and control rotation gates 535, 537 based on an $H_{pq}$ value and coupled to the Q and phase qubits. A control-Z gate 540 coupling the Q−1 and Q qubits follows the Y-basis circuit 508, and corresponds to the control Z gate 532. A set 542 of CNOT gates is illustrated, showing concluding CNOT gates for the P, Q circuits 534, 536 and initial CNOT gates for P, Q+1 H-basis circuit 548. However, these CNOT gates can be omitted as all cancel except for CNOT gate 543. A control-Z gate 544 couples the Q and Q+1 qubits and corresponds to the control-Z gate 532 used for processing based on spin orbitals P, Q. Only a portion of the H-basis circuit 548 is shown, including a control rotation gate coupling phase and Q+1 qubits, and based on a value of $H_{p(q+1)}$. Circuits for additional spin orbitals and additional Trotter-Suzuki steps can be provided.

FIG. 5C illustrates a circuit such as that of FIG. 5B. A set 560 of CNOT gates couples qubits (P+1, P+2), . . . , (Q−2, Q−1). A control-Z gate 562 is followed by an H-basis circuit 564 and a Y-basis circuit 566 that include CNOT gates coupling the P, Q qubits, basis change gates (H or Y, respectively), and control rotation gates based on an $H_{pq}$ value and coupled to the Q and phase qubits. A control-Z gate 567 coupling the Q−1 and Q qubits follows the Y-basis circuit 566, and corresponds to the control Z gate 562, but for different qubits. A CNOT gate 568 is followed by a control-Z gate 569 coupling the Q, Q+1 qubits. The CNOT gate 568 can be viewed as the sole non-cancelling CNOT gate such as those shown in the 542 of FIG. 5B. The control-Z gate 569 couples the Q and Q+1 qubits and corresponds to the control-Z gate 562 used for processing based on spin orbitals P, Q. An H-basis circuit 570 and a Y-basis circuit 578 for processing based on spin orbitals P, Q+1, i.e., using $H_{p(q+1)}$ follow the control-Z gate 569. Circuits for additional spin orbitals and additional Trotter-Suzuki steps can be provided.

Figure 6:
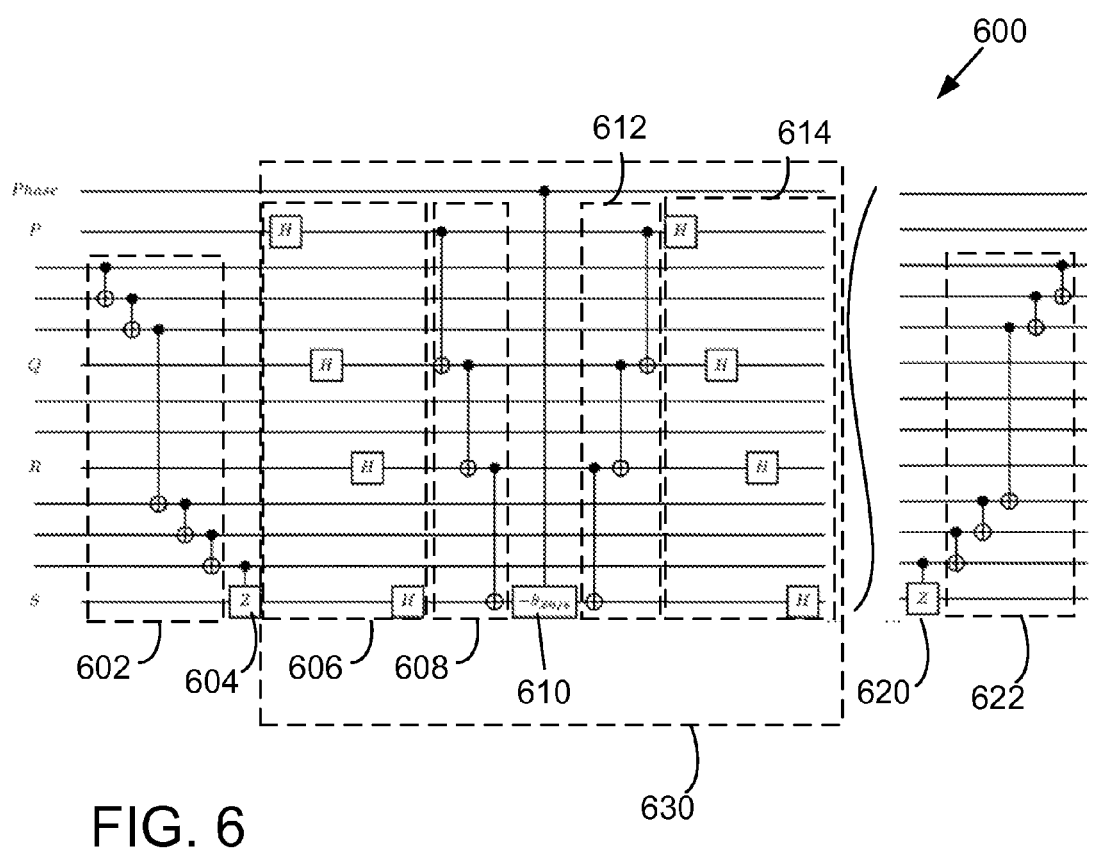
FIG. 6 illustrates a quantum circuit for performing chemical calculations based on two-body terms in a second quantized Hamiltonian.

FIGS. 2-5C illustrate circuits for computation based on values of $H_{pq}$. The circuits are simpler, using fewer gates, and permit more rapid computation. However, computations based on $H_{pqrs}$ values generally are more complex and are more time-intensive. A representative circuit for use with these values is illustrated in FIG. 6. Referring to FIG. 6, computation qubits P, P+1, . . . , Q of a set of N qubits are illustrated in a circuit 600, wherein N is a number of spin orbitals. For computations associated with $H_{pqrs}$, a set 602 of CNOT gates couples qubits (P+1, P+2), . . . , (Q−2, Q−1) and qubits (R+1, R+2), . . . , (S−2, S−1). A control-Z gate 604 couples qubits S−1, S. An H-transform circuit 606 includes Hadamard gates coupled to the qubits P, Q, R, S. A set of CNOT gates 608 couples qubits (P, Q), (Q, R), and (R, S). A control Z gate 610 applies a phase change/rotation based on a value of $H_{pqrs}$. A set 612 of CNOT gates is then followed by an H-transform circuit 614 that includes Hadamard gates associated with P, Q, R, S qubits. For convenience, a circuit 630 that includes the H transform circuits 606, 614 (the basis change gates, in this example, Hadamard gates), the sets 608, 612 of CNOT gates coupling the P, Q, R, S qubits, and the control-Z gate associated with value of $H_{pqrs}$ is referred to as an H-basis circuit. Similar circuits can be provided using Y-gates instead of Hadamard gates on some or all of the P, Q, R, S qubits. These circuits can be arranged in series with the H-basis circuit 630. The table below shows some possible combinations of basis change gates assigned to different qubits.

| Qubit | P | Q | R | S | Circuit |
|---|---|---|---|---|---|
| | H | H | H | H | HHHH |
| | H | H | Y | Y | HHYY |
| | Y | Y | H | H | YYHH |
| | Y | Y | Y | Y | YYYY |

The sequence of circuits can be repeated for additional Trotter-Suzuki iterations. After the final circuit of the sequence, a control-Z gate 620 is situated to couple the S−1, S qubits followed by a set 622 of CNOT gates similar to the set 602 but in reverse order.

Figure 7A:
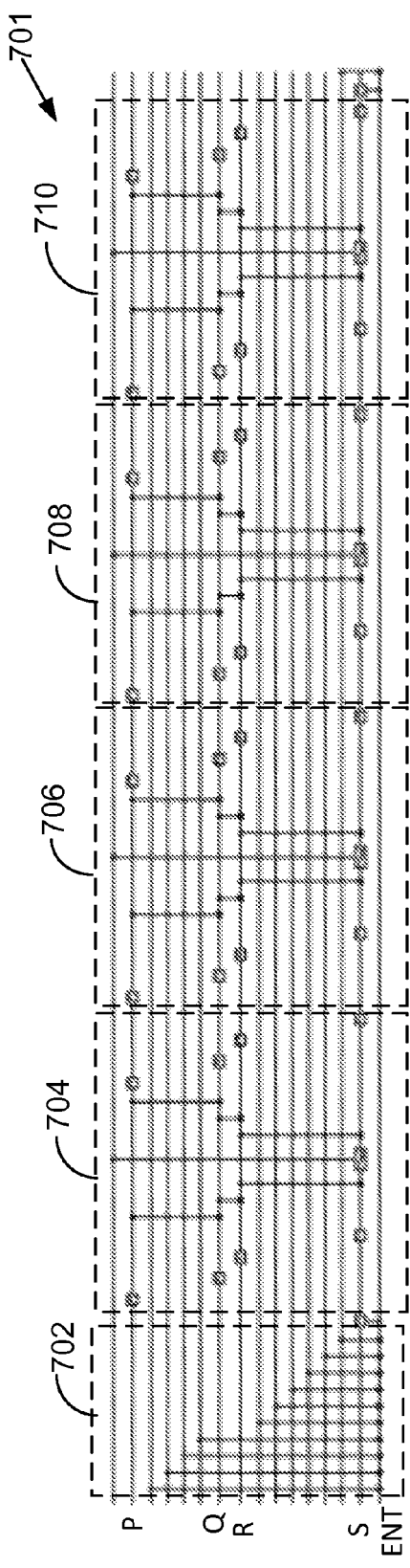
FIGS. 7A-7D illustrate two body circuits using different bases.
Figure 7B:
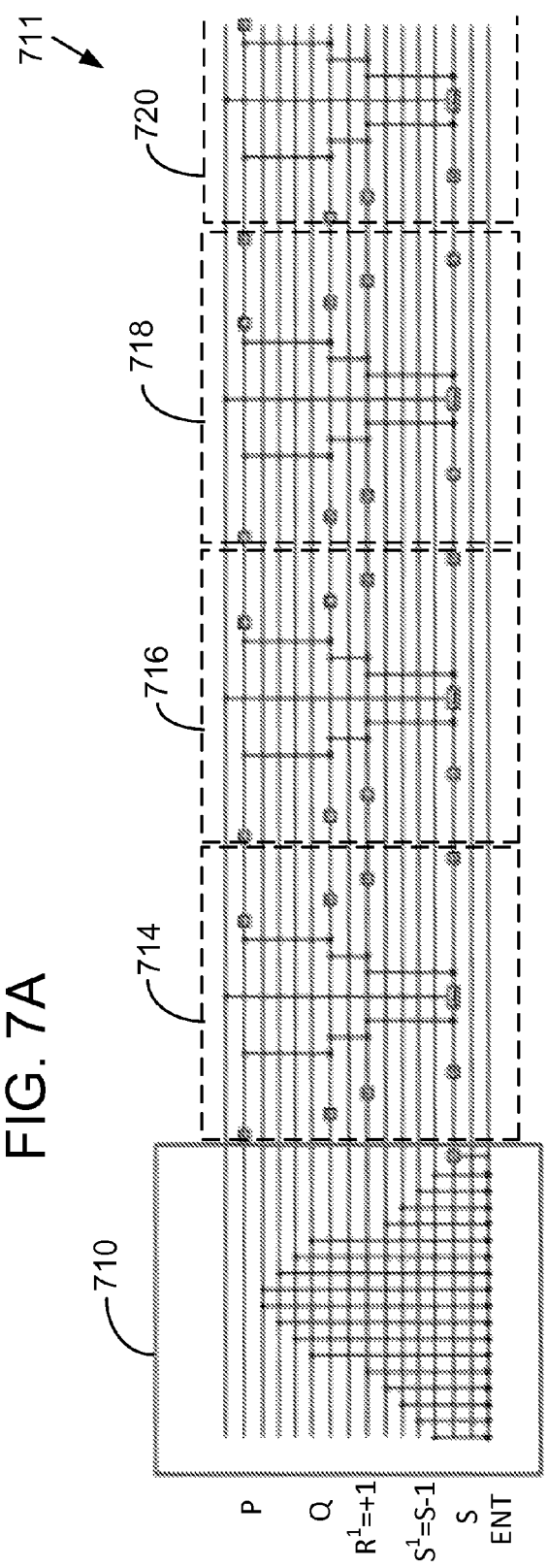
Figure 7C:
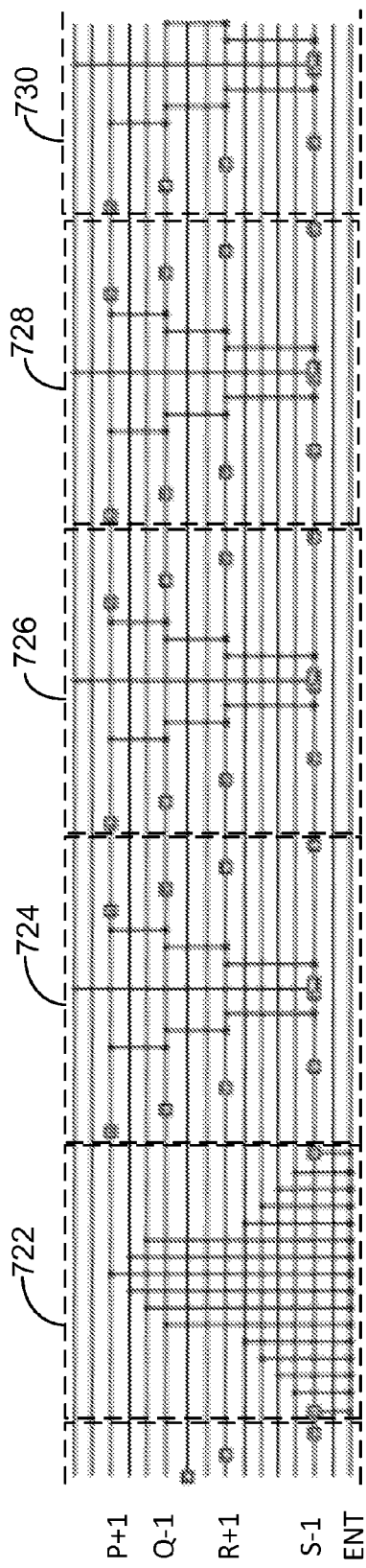
Figure 7D:
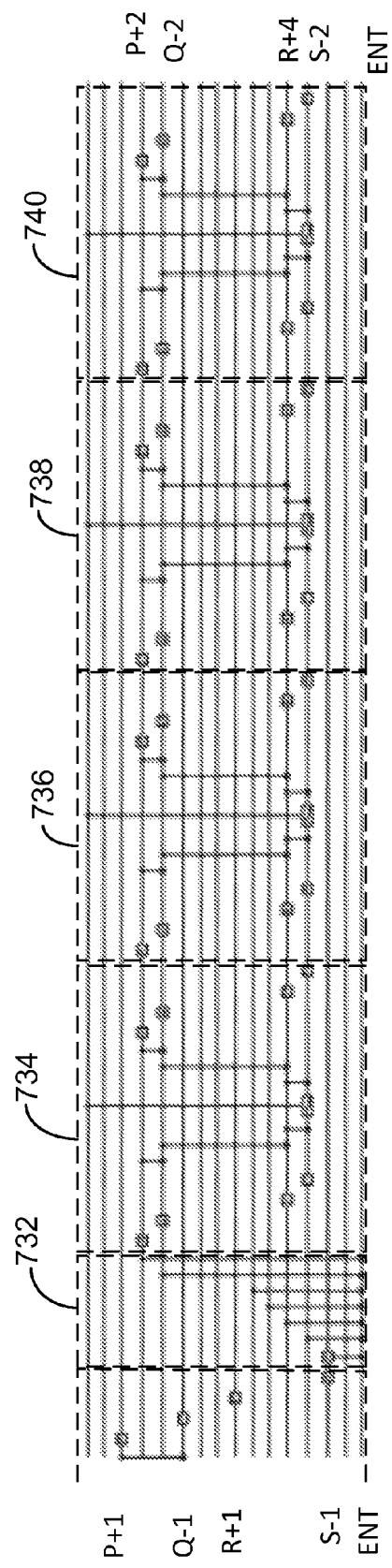

Subterms in a circuit can be re-ordered to cancel Jordan-Wigner strings to obtain a speedup of up to a factor of N. FIGS. 7A-7B show circuits 701, 711 for selected basis terms (such as HHYY, YYHH) for $H_{pqrs}$ and $H_{pqr's'}$, respectively, wherein s≠s',r≠r'. The circuits 701, 711 include respective Jordan-Wigner strings 702, 710. The R, S circuit 701 includes an HHHH circuit 704, an HHYY circuit 706, a YYHH circuit 708, and a YYYY circuit 710. The R', S' circuit 711 includes corresponding basic circuits 714, 715, 718, and 720. FIGS. 7C-7D illustrate additional quantum circuits for additional qubits defined by CNOT gate strings 722, 732 and various basis circuits 724-730, 732-740.

Figure 8A:
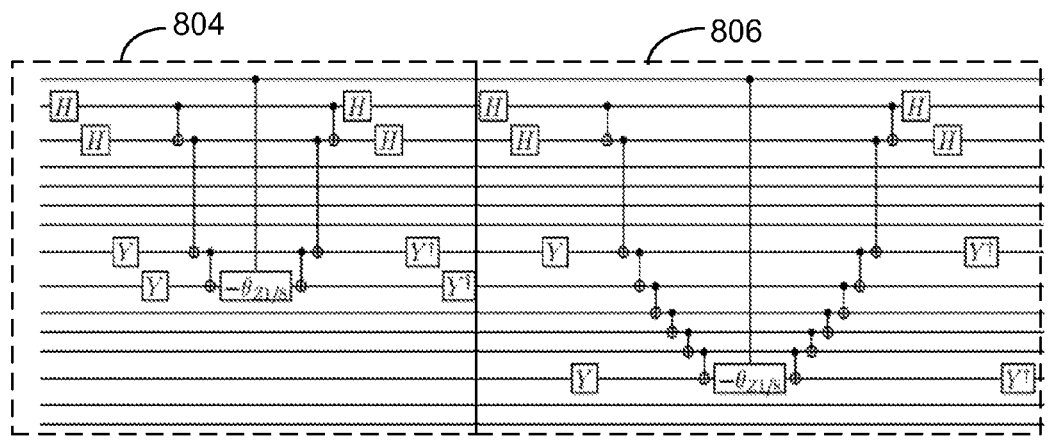
FIGS. 8A-8B illustrate simplification of the circuit of FIGS. 7A-7B based on reordering
Figure 8B:
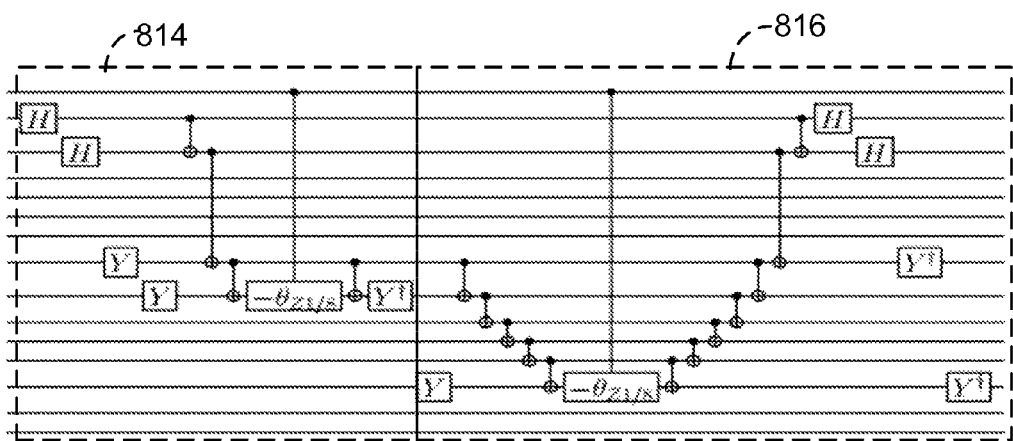
Figure 9A:
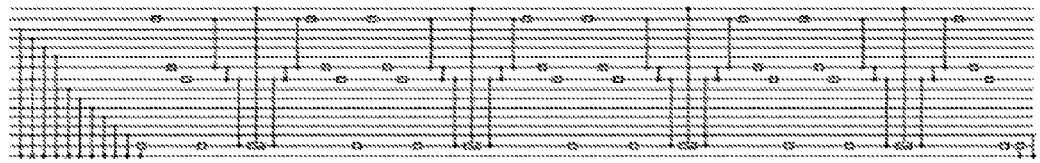
FIGS. 9A-9D illustrate a circuit prior to nesting and CNOT gate removal
Figure 9B:
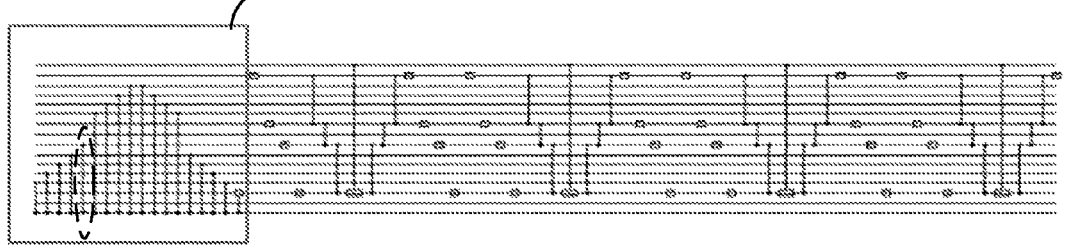
Figure 9C:
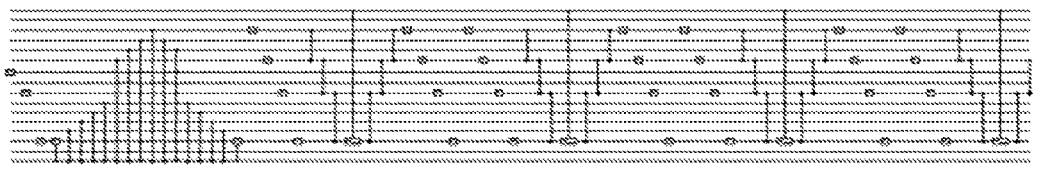
Figure 9D:
Figure 10A:
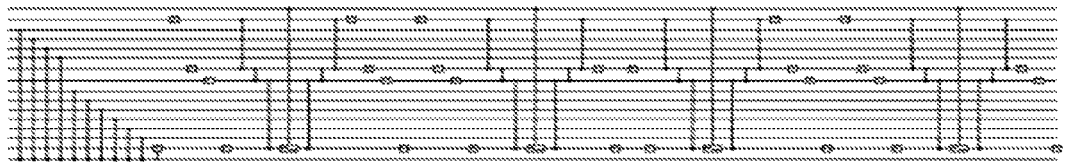
FIGS. 10A-10D illustrate a simplified circuit corresponding to that of FIGS. 9A-9D
Figure 10B:
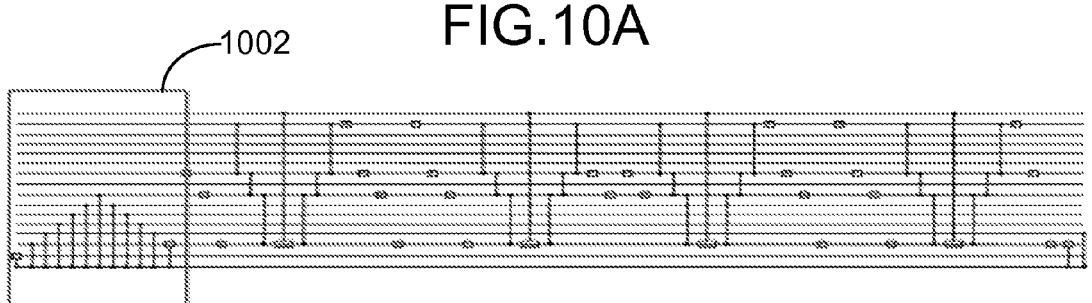
Figure 10C:
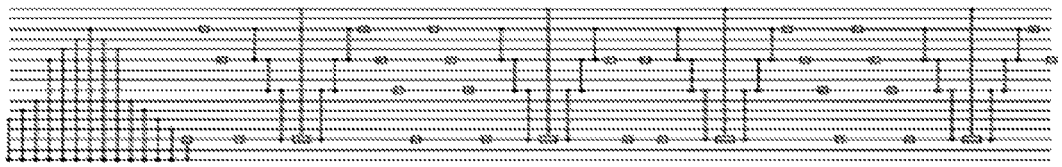
Figure 10D:
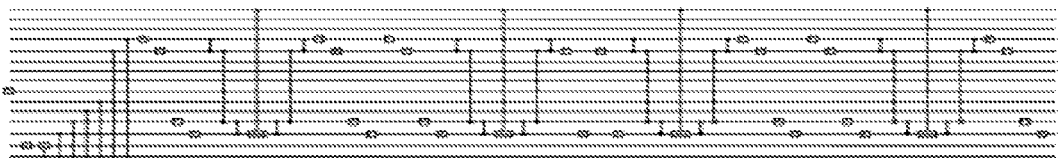

The circuits of FIGS. 7A-7D can be simplified by reordering. Referring to FIG. 8A, an HHYY basis circuit 804 for $H_{pqrs}$ is coupled to an HHYY circuit 806 for $H_{pqr's'}$, instead of coupling HHYY and YYHH basic circuits for $H_{pqrs}$ in series as shown in FIGS. 7A-7B. Because $H^2=YY^\dagger=I$, the final H and Y gates of the circuit 804 and the initial H and Y gates of the circuit 806 that operation on the same qubits can be eliminated. FIG. 8B shows a reduced HHYY basis circuit 814 for $H_{pqrs}$ and a reduced HHYY basis circuit 816 for $H_{pqr's'}$. Initial and/or final basis change gates are removed.

Adding additional qubits such as an entanglement qubit or one or more ancillary qubits allows significant parallelization. Addition of more than one ancilla qubit can increase the extent of parallelization as gates that act on distinct qubits can be executed in parallel. For example, terms associated with $H_{p'q'r's'}$ and $H_{pqr's'}$ can be executed in parallel if $p<q<r<s<p'<q'<r'<s'$ since the associated unitary operators act on different qubits. For two $H_{pqrs}$ terms, given any choice of p,q,r,s and p',q',r',s' for which the sites intersect at an even number of sites in the Jordan-Wigner string (i.e., the associated series of CNOT gates) of the p,q,r,s term, the p',q',r',s' term does not change parity and hence can be moved through the Jordan-Wigner string. This is referred to as nesting as terms can be executed in parallel when one sits inside another (for example, when $p<p'<q$ and $r<r'<s$). FIGS. 9A-9D illustrate a circuit prior to nesting and CNOT gate removal. Many CNOT gates in a sequence 902 of CNOT gates (most of the CNOT gates of a full Jordan-Wigner series) can be cancelled. A result of this cancellation is shown in FIGS. 10A-10D at 1002. A series of CNOT gates (such as the server 710 of FIG. 7B, referred to as a Jordan-Wigner string) 710 can be simplified to a series 1002 as shown in FIGS. 10A-10D. Further cancellations are possible in 1002 using the ability to commute CNOTs that act on the same target ancilla. A corresponding nested circuit is shown in FIGS. 11A-11C using ancillary qubits 1102. Different orderings are possible.

The discussion above applies to arbitrary $H_{pq}$ and $H_{pqrs}$. However, in many applications these will be sparse, meaning that they have many zero entries. Examples of this include simulations of the Hubbard model, simulations of long polymers, and simulations with symmetry. In such cases, many terms are zero, but large reductions in the complexity can still be obtained by the appropriate ordering of the terms for each case.

Representative Computing Environments

Figure 12:
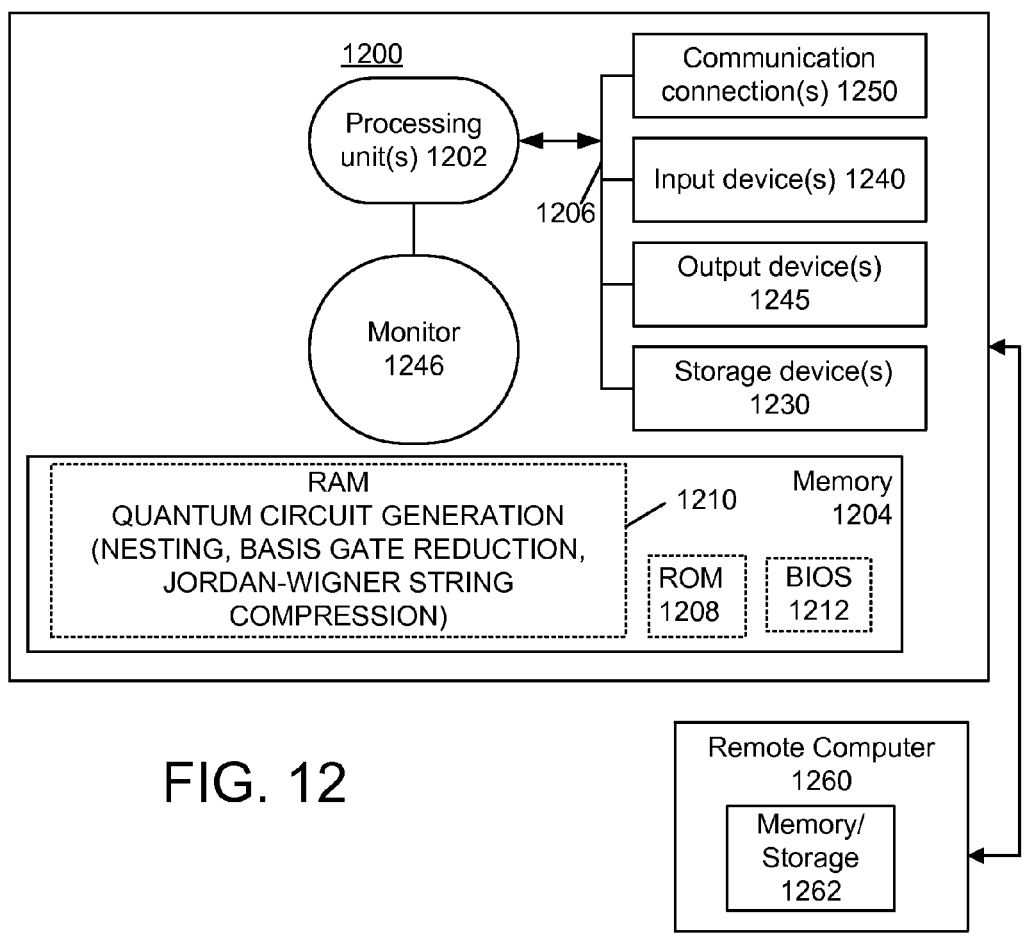
FIG. 12 is a block diagram of a representative computing environment in which the disclosed methods can be implemented.

FIG. 12 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 12, an exemplary system for implementing the disclosed technology includes a general purpose computing device in the form of an exemplary conventional PC 1200, including one or more processing units 1202, a system memory 1204, and a system bus 1206 that couples various system components including the system memory 1204 to the one or more processing units 1202. The system bus 1206 may be any of several types of bus structures including a memory bus or memory controller, a peripheral bus, and a local bus using any of a variety of bus architectures. The exemplary system memory 1204 includes read only memory (ROM) 1208 and random access memory (RAM) 1210. A basic input/output system (BIOS) 1212, containing the basic routines that help with the transfer of information between elements within the PC 1200, is stored in ROM 1208. As shown in FIG. 2, RAM 1210 can store computer-executable instructions for defining and coupling quantum circuits such as quantum circuits, with reduced basis transforms, shortened or combined Jordan-Wigner strings, or with nested quantum gates. In addition, some functions and procedures can be selected for implementation in conventional (non-quantum) computing hardware.

The exemplary PC 1200 further includes one or more storage devices 1230 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 1206 by a hard disk drive interface, a magnetic disk drive interface, and an optical drive interface, respectively. The drives and their associated computer readable media provide nonvolatile storage of computer-readable instructions, data structures, program modules, and other data for the PC 1200. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1230 including an operating system, one or more application programs, other program modules, and program data. Storage of quantum syntheses and instructions for obtaining such syntheses can be stored in the storage devices 1230. For example, nesting arrangements, reduced basis circuits, circuit series order, and CNOT gate cancellations can be defined by a quantum computer design application and circuit definitions can be stored for use in design. A user may enter commands and information into the PC 1200 through one or more input devices 1240 such as a keyboard and a pointing device such as a mouse. Other input devices may include a digital camera, microphone, joystick, game pad, satellite dish, scanner, or the like. These and other input devices are often connected to the one or more processing units 1202 through a serial port interface that is coupled to the system bus 1206, but may be connected by other interfaces such as a parallel port, game port, or universal serial bus (USB). A monitor 1246 or other type of display device is also connected to the system bus 1206 via an interface, such as a video adapter. Other peripheral output devices, such as speakers and printers (not shown), may be included. In some cases, a user interface is display so that a user can input a circuit for synthesis, and verify successful synthesis.

The PC 1200 may operate in a networked environment using logical connections to one or more remote computers, such as a remote computer 1260. In some examples, one or more network or communication connections 1250 are included. The remote computer 1260 may be another PC, a server, a router, a network PC, or a peer device or other common network node, and typically includes many or all of the elements described above relative to the PC 1200, although only a memory storage device 1262 has been illustrated in FIG. 12. The personal computer 1200 and/or the remote computer 1260 can be connected to a logical a local area network (LAN) and a wide area network (WAN). Such networking environments are commonplace in offices, enterprise wide computer networks, intranets, and the Internet.

When used in a LAN networking environment, the PC 1200 is connected to the LAN through a network interface. When used in a WAN networking environment, the PC 1200 typically includes a modem or other means for establishing communications over the WAN, such as the Internet. In a networked environment, program modules depicted relative to the personal computer 1200, or portions thereof, may be stored in the remote memory storage device or other locations on the LAN or WAN. The network connections shown are exemplary, and other means of establishing a communications link between the computers may be used.

Figure 13:
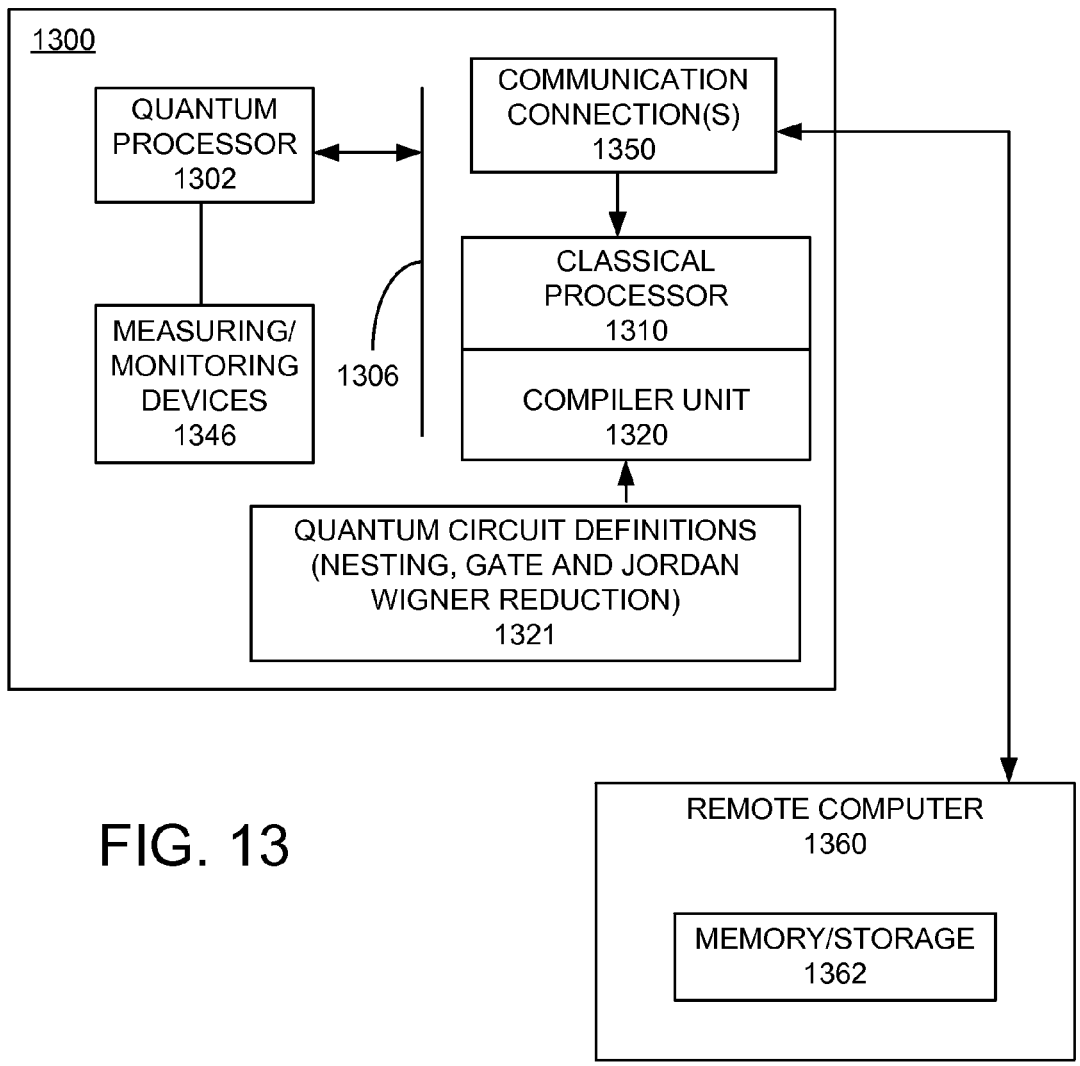
FIG. 13 is a block diagram of a representative computing environment that includes classical and quantum processing.

With reference to FIG. 13, an exemplary system for implementing the disclosed technology includes computing environment 1300, where compilation into quantum circuits is separated from quantum processing that uses the compiled circuits. The environment includes a quantum processing unit 1302 and one or more monitoring/measuring device(s) 1346. The quantum processor executes quantum circuits that are precompiled by classical compiler unit 1320 using one or more classical processor(s) 1310. The precompiled quantum circuits are downloaded into the quantum processing unit via quantum bus 1306. In some cases, quantum circuits or portions thereof are predefined and stored as quantum circuit definitions in a memory 1321. For example, nested or reduced basis quantum circuits associated with second quantization calculations can be stored in a library. A classical computer can be arranged to control a quantum computer or one or more quantum circuits thereof. The classical computer can receive the output of a classical or quantum computer. Based on the received output, the classical computer indicates which quantum circuits are to be used in subsequent quantum computations, provides definitions of suitable quantum circuits, or, in some cases, controls additional classical computations.

With reference to FIG. 13, the compilation is the process of translation of a high-level description of a quantum algorithm into a sequence of quantum circuits. Such high-level description may be stored, as the case may be, on one or more external computer(s) 1360 outside the computing environment 1300 utilizing one or more memory and/or storage device(s) 1362, then downloaded as necessary into the computing environment 1300 via one or more communication connection(s) 1350. The high-level description can be stored and interpreted classically, and a classical computer can control the sequence of gates defined in a quantum computer. The high level description also controls application of gates based on initial, intermediate, or final data values.

FIG. 14 illustrates a representative design method 1400. At 1402, second quantization Hamiltonian terms are obtained, and at 1404 corresponding reduced Hamiltonian circuits are defined. As used herein, reduced Hamiltonian circuits refers to quantum circuits that include a control-Z gate associated with a Hamiltonian coefficient but lack at least one input side or output side basis change gate for at least one qubit corresponding to the associated spin orbitals. At 1406, one or more CNOT gates in a Jordan Wigner string are cancelled, and additional basis change gates are canceled at 1408. At 1410 selected gates are moved and in some cases, still more gates can be cancelled. At 1412, a final circuit design is available.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

The invention claimed is:

1. A quantum circuit, comprising:
at least one reduced Jordan-Wigner circuit coupled to a plurality of qubits and including a plurality of CNOT gates corresponding to respective spin orbitals p,q,r,s, wherein p,q,r,s are integers such that $p<q<r<s$; and
a reduced Hamiltonian circuit coupled to p,q,r,s qubits associated with the p,q,r,s spin orbitals.

2. The quantum circuit of claim 1, further comprising a plurality of reduced Hamiltonian circuits situated in series and having different basis change gates.

3. The quantum circuit of claim 2, further comprising an output side reduced Jordan-Wigner string corresponding to the input side reduced Jordan-Wigner string, the output side reduced Jordan-Wigner string situated after the plurality of reduced Hamiltonian circuits.

4. The quantum circuit of claim 1, wherein the basis change gates are Hadamard gates and Y-gates.

5. The quantum circuit of claim 1, wherein CNOT gates of the reduced Jordan-Wigner circuit couple selected qubits in a set of qubits associated with spin orbitals p, . . . , s to each other.

6. The quantum circuit of claim 1, wherein CNOT gates of the reduced Jordan-Wigner circuit are coupled to an entanglement qubit.

7. The quantum circuit of claim 1, further comprising at least one one-body reduced Jordan-Wigner circuit coupled to the plurality of qubits and including a plurality of CNOT gates corresponding to respective spin orbitals p,q, wherein p,q are integers such that $p<q$; and
a one-body reduced Hamiltonian circuit coupled to p,q qubits associated with the p,q spin orbitals.

8. A method of defining a quantum circuit associated with at least a selected one-body or two-body Hamiltonian coefficient associated with second quantization, comprising:
defining a reduced Jordan-Wigner string associated with spin orbitals coupled by a Hamiltonian coefficient;
defining a reduced Hamiltonian circuit based at least on selected Hamiltonian coefficient; and
coupling the reduced Jordan-Wigner string to the reduced Hamiltonian on an input side.

9. The method of claim 8, further comprising defining a series of reduced Hamiltonian circuits associated with at least two basis operators and one or more Hamiltonian coefficients, and coupling the reduced Jordan-Wigner string in series with the series of reduced Hamiltonian circuits on the input side.

10. The method of claim 8, wherein the Hamiltonian coefficient is a one-body Hamiltonian coefficient or a two-body Hamiltonian coefficient.

11. The method of claim 8, wherein the basis operators are defined by Hadamard gates, Y-gates, or combinations thereof.

12. The method of claim 11, further comprising defining the reduced Hamiltonian circuit to include input side basis change gates corresponding to a selected set of spin orbitals, and output side basis change gates for at most one of the selected spin orbitals.

13. The method of claim 12, defining the reduced Jordan-Wigner string as a series of CNOT gates coupled to an entanglement qubit.

14. The method of claim 12, wherein the Hamiltonian coefficient is associated with a two body Hamiltonian coefficient coupling spin orbitals p,q,r,s, wherein p,q,r,s are integers such that p<q<r<s, and the reduced Jordan-Wigner string is an interior Jordan-Wigner string coupling the p,q,r,s spin orbitals.

15. The method of claim 14, wherein the reduced Hamiltonian circuit is defined to include input side basis change gates for p,q,r,s qubits associated with the p,q,r,s spin orbitals.

16. The method of claim 15, further comprising defining a plurality of reduced Hamiltonian circuits coupled in series based on selected Hamiltonian coefficients, and coupling a first reduced Hamiltonian circuit of the plurality to the reduced Jordan-Wigner string and a last reduced Hamiltonian circuit of the plurality to a final Jordan-Wigner string.

17. The method of claim 15, wherein the reduced Jordan-Wigner string is associated with spin orbitals coupled by a Hamiltonian coefficient of the form $H_{pqrs}$, and further comprising:
defining a reduced Hamiltonian circuit associated a Hamiltonian coefficient of the form $H_{p'q'r's'}$; and
defining a coupling of the reduced Hamiltonian circuits together with CNOT gates corresponding to respective Jordan-Wigner strings in which CNOT gates coupled to common qubits are omitted, wherein the Jordan-Wigner strings include CNOT gates coupled to an entanglement qubit.

18. The method of claim 17, further comprising removing at least one CNOT gate associated with the Jordan-Wigner strings in the defined circuit.

19. The method of claim 8, wherein at least one qubit in the reduced Hamiltonian circuit is situated so as to be processed without a basis change at one or both of an input or output of the reduced Hamiltonian circuit.

20. A computing device having computer executable instructions stored therein for performing a method, comprising:
defining a plurality of reduced Hamiltonian circuits associated with one-body and two-body interactions in a second quantized Hamiltonian;
determining a plurality of Jordan-Wigner series for coupling the reduced Hamiltonian circuits;
cancelling at least selected CNOT gates in the plurality of series that couple to common qubits; and
identifying common basis change gates in the defined reduced Hamiltonian circuits that are applied to a common qubit and removing the common basis change gates from the reduced Hamiltonian circuit definitions.

* * * * *